United States Patent [19]

Beecham et al.

[11] 4,216,395

[45] Aug. 5, 1980

[54] DETECTOR CIRCUITRY

[75] Inventors: David Beecham, Coopersburg; Jack Kane, Bethlehem, both of Pa.

[73] Assignee: Bell Telephone Laboratories, Incorporated, Murray Hill, N.J.

[21] Appl. No.: 869,845

[22] Filed: Jan. 16, 1978

[51] Int. Cl.² .................. H03K 5/18; H03K 3/286; H03K 3/353; G11C 8/00

[52] U.S. Cl. .......................... 307/350; 307/264; 307/279; 307/DIG. 1; 365/230

[58] Field of Search ............ 307/238, 350, 264, 279, 307/DIG. 1, DIG. 3, DIG. 5; 365/189, 190, 230, 231

[56] References Cited

U.S. PATENT DOCUMENTS

| | | | |
|---|---|---|---|
| 3,539,839 | 11/1970 | Igarashi | 307/279 X |
| 3,795,898 | 3/1974 | Mehta et al. | 365/230 |
| 3,902,082 | 8/1975 | Proebsting et al. | 307/DIG. 5 X |
| 3,906,464 | 9/1975 | Lattin | 307/DIG. 5 X |
| 3,959,781 | 5/1976 | Mehta et al. | 307/DIG. 1 X |
| 3,987,315 | 10/1976 | Matsue | 307/DIG. 1 X |
| 4,024,512 | 5/1977 | Amelio et al. | 307/DIG. 1 X |
| 4,031,415 | 6/1977 | Redwine et al. | 307/DIG. 3 X |
| 4,038,646 | 7/1977 | Mehta et al. | 307/DIG. 1 X |
| 4,074,148 | 2/1978 | Sato | 307/DIG. 1 X |
| 4,077,031 | 2/1978 | Kitagawa et al. | 307/DIG. 1 X |

Primary Examiner—Larry N. Anagnos
Attorney, Agent, or Firm—Irwin Ostroff

[57] ABSTRACT

A low power high sensitivity detector having two pairs of MOS cross coupled transistors, voltage equalization circuitry, and a single input, with no external reference, forms the basic configuration of a detector-level shifter circuit which is compatible with today's single chip large capacity memories. The lengths of the channels of one of the pairs of cross coupled transistors are designed to be longer than the other pair. This provides a built-in imbalance which provides good tolerance to transistor parameter variation due to semiconductor processing variations.

4 Claims, 1 Drawing Figure

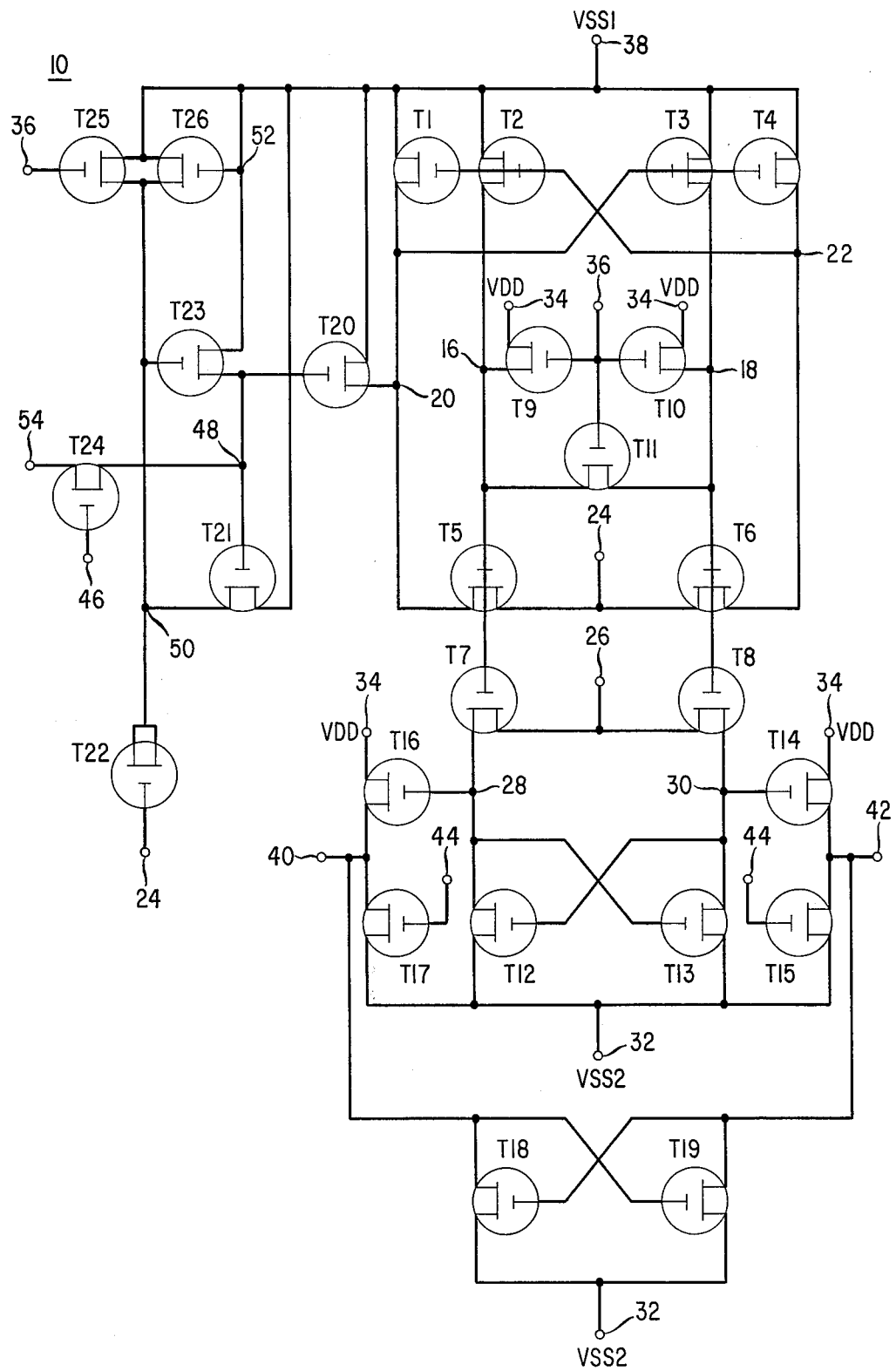

DETECTOR CIRCUITRY

BACKGROUND OF THE INVENTION

This invention relates to detector circuitry, and in particular, to low power high sensitivity MOS detector circuits.

A semiconductor input buffer used in a commercially available 16K n-channel Random Access Memory (RAM) comprises two pairs of cross coupled MOS transistors and equalization circuitry with the channel widths of one pair of transistors being different from the channel widths of the other pair. It also uses a reference potential. Reducing the channel widths of one of the two pairs of the transistors does reduce the gain and will provide the desired imbalance; however, there is only a slight increase in threshold voltage and accordingly processing variations can significantly cut into yields. In addition, the reference voltage is another parameter which must be closely controlled.

It would be desirable to have an input buffer of the type discussed above in which no externally supplied reference voltage is necessary and which is more immune to semiconductor processing variations.

SUMMARY OF THE INVENTION

The present invention is a detector circuit which essentially comprises first and second pairs of cross coupled switching devices T1, T2, T3, and T4, and voltage equalization circuitry (which in a preferred embodiment comprises three switching devices T9, T10, and T11) and two additional switching devices T5 and T6. An additional transistor T20 is also used in conjunction with T1 and T2. T1, T2, T3, T4, T5, T6, T7, T8, T9, T10, T11 and T20 each comprise a control terminal and first and second output terminals.

T1, T2, T3, and T4 are typically MOS transistors. The channel length of an MOS transistor is defined as the distance between the drain and source. The channel length of one pair of MOS transistors T3 and T4 is selected to be less than those of the other pair T1 and T2. The shorter channel length of T3 and T4 increases the gain of T3 and T4 compared to T1 and T2 and significantly decreases the threshold voltages thereof compared to T1 and T2. This causes the detector circuit to latch up to a predetermined output level without any input signal applied. The difference in channel lengths between T1 and T2 and T3 and T4 enables the detector to have significantly more noise margin than if the channel widths thereof had been varied. This also facilitates greater production yields because the detector can tolerate greater threshold voltage variations that occur because of processing variations than previous similar circuits in which the channel widths of the transistors are different.

Another feature of the preferred form of the invention is voltage level adjusting circuitry coupled to the control terminal of T20. This circuitry is adapted to convert a TTL (transistor-transistor logic) "0" level to an MOS "0." This increases the operating noise margin.

The detector operates dynamically and there is essentially no steady-state DC power dissipation and, therefore, relatively low power dissipation. In addition, the detector is characterized by high input sensitivity.

The present invention basically comprises a cross coupled pair of field effect transistors with the channel length of one transistor being greater than the other such that the pair latches up to predetermined output levels without an input signal applied thereto. This cross coupled pair is useful in many applications to perform sensing and logic operations.

These and other features and advantages of the invention will be better understood from consideration of the following detailed description taken in conjunction with the accompanying drawing.

BRIEF DESCRIPTION OF THE DRAWING

The FIGURE illustrates an embodiment of the present invention.

DETAILED DESCRIPTION

Referring now to the FIGURE, there is illustrated a detector-level shifter circuit 10 comprising MOS field effect transistors T1 through T26. A field effect transistor whose gate is charged sufficiently to allow conduction between the drain and source will be denoted as enabled. Conversely, if the gate is not sufficiently charged to allow conduction, the transistor will be denoted as disabled.

The sources of T1, T2, T3, T4, T20, T21, T23, T25 and T26 and the gate of T26 are connected together to terminal 38 and the VSS1. The gates of T1 and T2 and the drain of T4 are all connected together to terminal 22 and to the source of T6. The gates of T3 and T4 and the drain of T1, and the drain of T20, are connected to terminal 20 and to the source of T5. The drains of T5 and T6 and the gate of T22 are connected together to terminal 24. The drains of T2 and T11, and the source of T9 and the gates of T5 and T7 are all connected together to terminal 16. The drain of T3 and the sources of T10 and T11, and the gates of T6 and T8 are all connected together to terminal 18. The gates of T9, T10, T11 and T25 are all connected to terminal 36. The drains of T9, T10, T14 and T16 are connected to terminal 34 and to power supply VDD. This configuration of T9, T10, and T11 serves as a voltage equalization circuit which selectively essentially equalizes the potentials of terminals 16 and 18.

The drains of T7 and T8 are connected together to terminal 26. The source of T7 is connected to terminal 28, the drain of T12, and to the gates of T13 and T16. The source of T8 is connected to terminal 30, the gates of T12 and T14 and to the drain of T13. The sources of T12, T13, T15, T17, T18 and T19 are connected together to terminal 32 and to power supply VSS2 (typically 0 volts). The source of T16 is connected to the drains of T17 and T18, the gate of T19 and inverting output terminal 40. The source of T14 is connected to the drains of T15 and T19, the gate of T18 and to noninverting output terminal 42. The gates of T15 and T17 are connected to terminal 44. VSS1 and VSS2, which are both typically held at 0 volts, are separated to provide a better noise margin.

An input terminal 54 is connected to the drain of T24. The gate of T24 is connected to terminal 46. The source of T24 is connected to terminal 48, the gates of T20 and T21, and to the drain of T23. The gate of T23 is connected to the drains of T21, T22, T25 and T26 and to the source of T22.

Circuit 10 is useful as an input address buffer-level shifter circuit which may be used as part of a dynamic random access memory. Typically, dynamic n-channel random access memories receive TTL voltage levels wherein a "0" signal level is typically plus 0.8 volts or less positive and "1" signal level is typically plus 2.2 volts or more positive. A noninverting output signal appears at terminal 42 and an inverting output signal appears at terminal 40. With VSS1 and VSS2 both equal to 0 volts and VDD equal to plus 12 volts, an output "0" level is typically 0 volts (ground potential) and an output "1" level is typically plus 10.5 volts (assuming a threshold voltage of 1.5 volts). These voltage levels are compatible with those used in many of today's n-channel dynamic MOS random access memories.

Initially terminals 24 and 26 are held at 0 volts and terminals 36, 44, and 46 are held at plus 12 volts. The combination of T9, T10 and T11 is well known and serves to set the potentials at terminals 16 and 18 to essentially equal values of approximately plus 10.5 volts (assuming a transistor threshold voltage of one and a half volts.) The potentials of the gates of T5, T6, T7 and T8 are thus sufficiently positive that all of these transistors are enabled. Terminals 20, 22, 28 and 30 are thus all discharged through enabled transistors T5, T6, T7 and T8, respectively, to essentially 0 volts. T15, T17 and T25 are also enabled and terminals 40, 42, and 50 are set to VSS2 (0 volts), VSS2 (0 volts) and VSS1 (0 volts), respectively. Terminals 36 and 44 are now pulsed to 0 volts and terminals 16, 18, 40, 42, and 50 hold the previously set potentials as charge on the parasitic capacitances (not illustrated) associated with these terminals and transistors connected thereto.

Assume that a "0" input signal of approximately 0 volts is now applied to terminal 54. This causes terminal 48 to go to 0 volts and disables T20. Terminal 46 is then pulsed to ground potential to disable T24. Terminal 24 is then pulsed from ground potential to plus 12 volts. T5 and T6, which are enabled, both begin to conduct and terminals 20 and 22 both start to rise in potential. Terminals 16 and 18 increase in potential because of the voltage self-bootstrapping action of T5 and T6. T3 and T4 become enabled and conduct before T1 and T2 because the channel lengths of T3 and T4 are shorter than those of T1 and T2 and therefore the gain of T3 and T4 is greater than that of T1 and T2. In addition, the threshold voltages of T3 and T4 are lower than those of T1 and T2. This causes terminal 18 to discharge through enabled T3 towards the 0 volt potential applied to terminal 38. This causes T6 to become less enabled and to act as a greater impedance and thus tends to limit the positive increase in potential of terminal 22. This in turn keeps T1 and T2 disabled and thus allows terminal 20 to continue to charge towards plus 12 volts through enabled T5. This maintains T3 and T4 enabled and thus allows terminal 18 to be discharged towards 0 volts (VSS1) while terminal 16 remains relatively undischarged. The above condition disables T6 and thereby cuts off all conduction therethrough. Terminal 22 also discharges through enabled T4 to the 0 volt potential of terminal 38 (VSS1). This condition insures that T1 and T2 stay disabled.

T5 remains enabled and terminal 20 is held at approximately plus 12 volts. There is essentially no DC flow of current through T1-T13 at this point in time.

Thus at this point, terminals 16 and 18, which started out at equal potentials, have developed a voltage differential of several volts; terminals 20 and 22, which started at 0 volts, have also developed a differential voltage of several volts.

Terminal 26 is then pulsed from 0 volts to plus 12 volts. T7 is enabled and thus terminal 28 rises in potential from 0 volts towards plus 12 volts. The potential of the gate of T7 is bootstrapped up several threshold voltages above plus 12 volts due to gate capacitances and the parasitic capacitance (not illustrated) between terminals 26 and 16. The voltage applied to terminal 26 appears at terminal 28 and enables T16. This causes terminal 40 to assume the VDD potential less a threshold voltage, a "1" (plus 10.5 volts). This enables T13 which then holds terminal 30 at 0 volts (the potential of VSS2). This disables T14 and thus output terminal 42 stays at 0 volts (VSS2). T8 is disabled during this time.

Thus, for a "0" input voltage level of 0 volts there occurs a "0" output signal level of plus 0 volts at terminal 42 (which serves as the detector-shifter circuit noninverting output terminal), and a "1" output signal level of 10.5 volts at terminal 40 (which serves as an inverting output terminal). The output voltage levels of plus 10.5 volts and 0 volts are typically "0" and "0" levels of an n-channel field effect transistor dynamic random access memory system with which circuit 10 can be used.

The "1" at output terminal 40 enables T19 which actively holds output terminal 42 at a "0" (at VSS2). The "0" at output terminal 40 disables T18 and thus allows the potential of terminal 42 to be held at VDD minus the threshold voltage of T16, a "1." Conversely, as will become apparent from the below discussion, when a "1" is applied to terminal 54, a "1" occurs at terminal 42 and a "0" occurs at terminal 40. This enables T18, which actively holds output terminal 40 at a "0" (VSS2). The "0" which occurs at terminal 40 disables T19 and thus allows the potential of terminal 42 to be held at VDD minus the threshold voltage of T14, a "1."

If a "1" is applied to input terminal 54 then the gate of T20 becomes sufficiently positive in potential to enable T20. This presents a low impedance in parallel with T1. This low impedance across T1 has the effect of overcoming the built-in imbalance caused by the channel lengths of T3 and T4 being less than those of T1 and T2. As terminal 24 is increased in potential from 0 volts to plus 12 volts, terminal 22 increases in potential much faster than 20. This causes T2 to be enabled before T3 and correspondingly for terminal 16 to be discharged relative to terminal 18. This results in an imbalance opposite to that where the input signal is a "0." The resulting output signals at terminals 40 and 42, are a "0" and a "1," respectively, for an input "1" applied to terminal 54.

The parasitic capacitance between the drain and gate of T20 serves to allow a portion of the positive going edge of the voltage pulse applied to terminal 24 to increase the potential of the gate of T20. If a "0" input level, typically 0 volts to plus 0.8 volts, on terminal 48 is increased in potential above the threshold voltage of T20, then T20 becomes enabled and an erroneous output signal can result. The circuitry comprising T21, T22, T23, T25 and T26 serves to set an input "0" level at terminal 48 to the VSS1 level (0 volts). This creates a hard "0" level and thereby helps insure that T20 stays off for an input "0" signal. The positive increase in the potential of terminal 24 is coupled to terminal 50 and causes T23 to become enabled and thus pulls terminal 48 to VSS1 (0 volts). Thus, a "weak" input "0" signal, typically plus 0.8 volts, is converted to a "hard" input "0" signal of 0 volts. The capacitance bootcoupling of the gate of T20 is thus overridden and the proper operation of circuit 10 is maintained. If an input "1" is applied via T24 to terminal 48, then T21, which has the gate thereof connected to terminal 48, is enabled and the increase in the potential of terminal 50 is coupled through T21 to VSS1. This keeps T23 disabled and thus the "1" voltage level of terminal 48 is not disturbed.

It is to be noted that during the entire operation of circuit 10 there is no steady-state DC current flow and therefore, power dissipation is kept relatively low. Also, high sensitivity is achieved because the voltage equalization circuitry acts to selectively equalize the potentials of terminals 16 and 18.

The detector-level shifter circuit 10 has been fabricated in integrated circuit form as part of a 16,384 bit n-channel dynamic random access memory and has been found to be functional.

It is to be understood that the embodiments described herein are merely illustrative of the general principles of the invention. Various modifications are possible within the scope of the invention. For example, p-channel MOS transistors can be substituted for n-channel MOS transistors providing all appropriate voltages are adjusted. Still further, T11 can be eliminated and other voltage equalization circuitry can be used.

What is claimed is:

1. Detector circuit means which is adapted to detect the logic state of a signal applied to the input terminal thereof and to provide at a first output terminal thereof a signal having the same logic state as is applied to the input terminal and to provide at a second output terminal thereof a signal which is of the opposite logic state comprising:

first, second, third, fourth, fifth and sixth field effect transistors T1, T2, T3, T4, T5, and T6, respectively, each of which comprises a gate terminal and first and second output terminals and has a channel having a preselected width and length;

voltage equalization circuit means;

the gate terminals of T1 and T2 being coupled together to the second output terminals of T4 and T6, the second output terminal of T2 being coupled to the control terminal of T5 and to the voltage equalization circuit means;

the gate terminals of T3 and T4 being coupled to the second output terminals of T1 and T5, the second output terminal of T3 being coupled to the voltage equalization circuit means and to the gate terminal of T6;

the first output terminals of T5 and T6 being coupled together;

the lengths of the channels of T1 and T2 are greater than the lengths of the channels of T3 and T4 such that the threshold voltages of T1 and T2 are significantly greater than the threshold voltages of T3 and T4;

a seventh switching device T20 having a control terminal and first and second output terminals with the second terminal thereof being coupled to the gate terminals of T3 and T4;

eighth and ninth switching devices T7 and T8, respectively, each of which comprises a control terminal and first and second output terminals;

the first output terminals of T7 and T8 being coupled together;

the control terminals of T5 and T7 being coupled together;

the control terminals of T6 and T8 being coupled together;

tenth, eleventh, twelfth, thirteenth, fourteenth, fifteenth, sixteenth, and seventeenth switching devices T12, T13, T14, T15, T16, T17, T18, and T19, respectively, each of which comprises a control terminal and first and second output terminals;

the control terminal of T13 being coupled to the second output terminal of T7, the first output terminal of T12, and to the control terminal of T16;

the control terminal of T12 being coupled to the second output terminal of T8, the first output terminal of T13, and to the control terminal of T14;

the second output terminal of T14 being coupled to the first output terminals of T15 and T19, to the control terminal of T18 and to a terminal which is adapted to serve as a first detector circuit means output terminal;

the second output terminal of T16 being coupled to the first output terminals of T17 and T18, to the control terminal of T19, and to another terminal which is adapted to serve as a second detector circuit means output terminal;

capacitive circuit means having first and second terminals;

eighteenth, nineteenth, twentieth, and twenty-first switching devices T21, T23, T25, and T26, respectively, each of which comprises a control terminal and first and second output terminals;

first circuit means for selectively allowing an input signal applied to a first terminal thereof, which serves as a detector circuit means input terminal, to be coupled therethrough to a second terminal thereof which is coupled to the control terminal of the seventh switching device T20 and to the control terminal of T21 and to the first output terminal of T23; and the second output terminals of T21, T25, and T26 being coupled together to the control terminal of T23 and to the second terminal of the capacitive circuit means.

2. The apparatus of claim 1 wherein all the switching devices are field effect transistors.

3. Detector circuit means comprising:

first, second, third, fourth, fifth, and sixth field effect transistors T1, T2, T3, T4, T5, and T6, respectively, each of which comprises a gate terminal and first and second output terminals and has a channel having a preselected width and length;

voltage equalization circuit means;

the gate terminals of T1 and T2 being coupled together to the second output terminals of T4 and T6, the second output terminal of T2 being coupled to the control terminal of T5 and to the voltage equalization circuit means;

the gate terminals of T3 and T4 being coupled to the second output terminals of T1 and T5, the second output terminal of T3 being coupled to the voltage equalization circuit means and to the gate terminal of T6;

the first output terminals of T5 and T6 being coupled together;

the lengths of the channels of T1 and T2 are greater than the lengths of the channels of T3 and T4 such that the threshold voltages of T1 and T2 are significantly greater than the threshold voltages of T3 and T4;

the gate terminal of T5 being coupled to a first detector circuit means output terminal;

a seventh switching device T20 having a control terminal and first and second output terminals with the second output terminal thereof being coupled to the gate terminals of T3 and T4;

capactive circuit means having first and second terminals;

eighth, ninth, tenth and eleventh switching devices T21, T23, T25, and T26, respectively, each of which comprises a control terminal and first and second output terminals;

first circuit means for selectively allowing an input signal applied to a first terminal thereof, which serves as a detector circuit means input terminal, to be coupled therethrough to a second terminal thereof which is coupled to the control terminal of the seventh switching device T20 and to the control terminal of T21 and to the first output terminal of T23; and the second output terminals of T21, T25, and T26 being coupled together to the control terminal of T23 and to the second terminal of the capacitive circuit means.

4. Detector circuit means comprising:

first, second, third, fourth, fifth and sixth field effect transistors T1, T2, T3, T4, T5, and T6, respectively, each of which comprises a gate terminal and first and second output terminals and has a channel having a preselected width and length;

voltage equalization circuit means;

the gate terminals of T1 and T2 being coupled together to the second output terminals of T4 and T6, the second output terminal of T2 being coupled to the control terminal of T5 and to the voltage equalization circuit means;

the gate terminals of T3 and T4 being coupled to the second output terminals of T1 and T5, the second output terminal of T3 being coupled to the voltage equalization circuit means and to the gate terminal of T6;

the first output terminals of T5 and T6 being coupled together;

the lengths of the channels of T1 and T2 are greater than the lengths of the channels of T3 and T4 such that the threshold voltages of T1 and T2 are significantly greater than the threshold voltages of T3 and T4;

a seventh switching device T20 having a control terminal and first and second output terminals with the second terminal thereof being coupled to the gate terminals of T3 and T4 and having a gate terminal which is coupled to a detector circuit means input terminal;

eighth and ninth switching devices T7 and T8, respectively, which each comprises a control terminal and first and second output terminals;

the first output terminals of T7 and T8 being coupled together;

the control terminals of T5 and T7 being coupled together;

the control terminals of T6 and T8 being coupled together;

tenth, eleventh, twelfth, thirteenth, fourteenth, fifteenth, sixteenth, and seventeenth switching devices T12, T13, T14, T15, T16, T17, T18, and T19, respectively, each of which comprises a control terminal and first and second output terminals;

the control terminal of T13 being coupled to the second output terminal of T7, the first output terminal of T12, and to the control terminal of T16;

the control terminal of T12 being coupled to the second output terminal of T8, the first output terminal of T13, and to the control terminal of T14;

the second output terminal of T14 being coupled to the first output terminals of T15 and T19, to the control terminal of T18 and to a terminal which is adapted to serve as a first detector circuit means output terminal; and the second output terminal of T16 being coupled to the first output terminals of T17 and T18, to the control terminal of T19, and to another terminal which is adapted to serve as a second detector circuit means output terminal.

* * * * *